(12) United States Patent
Nomura et al.

(10) Patent No.: US 9,042,951 B2
(45) Date of Patent: May 26, 2015

(54) INTERMEDIATE CONNECTION UNIT OF SUPERCONDUCTING CABLES

(71) Applicant: FURUKAWA ELECTRIC CO., LTD., Tokyo (JP)

(72) Inventors: Tomoya Nomura, Tokyo (JP); Masashi Yagi, Tokyo (JP); Takaharu Mitsuhashi, Tokyo (JP); Jun Teng, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/236,595

(22) PCT Filed: Feb. 6, 2013

(86) PCT No.: PCT/JP2013/052756
§ 371 (c)(1),
(2) Date: Jan. 31, 2014

(87) PCT Pub. No.: WO2013/179690
PCT Pub. Date: Dec. 5, 2013

(65) Prior Publication Data
US 2015/0080225 A1    Mar. 19, 2015

(30) Foreign Application Priority Data

May 28, 2012 (JP) .................... 2012-120687

(51) Int. Cl.
*H01L 39/14* (2006.01)
*H01B 12/16* (2006.01)
*H01B 12/02* (2006.01)

(52) U.S. Cl.
CPC ............. *H01B 12/16* (2013.01); *H01B 12/02* (2013.01); *H01L 39/143* (2013.01)

(58) Field of Classification Search
CPC ..... H01L 39/143; H01L 39/248; H01L 39/14; H01B 12/06
See application file for complete search history.

(56) References Cited

U.S. PATENT DOCUMENTS

| 7,928,321 B2 * | 4/2011 | Corsaro et al. ............. 174/125.1 |
| 8,340,737 B1 * | 12/2012 | Arndt et al. ................... 505/220 |
| 8,385,994 B2 * | 2/2013 | Kodama et al. .............. 505/231 |
| 8,838,194 B2 * | 9/2014 | Calvert ........................ 505/231 |

FOREIGN PATENT DOCUMENTS

| JP | S5033234 | 10/1975 |
| JP | H0518231 | 3/1993 |
| JP | 2001112139 | 4/2001 |
| JP | 2005353379 | 12/2005 |
| JP | 201145169 | 3/2011 |

OTHER PUBLICATIONS

International Search Report for PCT Application Serial No. PCT/JP2013/052756, mailed Mar. 26, 2013, 4 pages.
International Preliminary Report on Patentability for PCT Application Serial No. PCT/JP2013/052756, mailed Dec. 2, 2014, 11 pages.

* cited by examiner

*Primary Examiner* — Colleen Dunn
(74) *Attorney, Agent, or Firm* — Amin, Turocy & Watson, LLP

(57) ABSTRACT

In an intermediate connecting unit 50 of superconducting cables, by forming the connecting superconducting wires 101 in a trapezoid shape tapered in the direction of the electric insulating layer 113 (the superconducting shield layers 114) sides from the large radius section 213*a* side of the reinforcement insulating layer 213, the inclined surface sections 213*b* can be covered without spaces and without the plurality of connecting superconducting wires overlapping. The plurality of connecting superconducting wires 101 cover the inclined surface sections 213*b* of the reinforcement insulating layer 213 formed thicker than the radius of the cable cores 11 of the superconducting cables 10. The connecting superconducting wires 101 further connects the superconducting wires 10 arranged on the outer periphery of the large radius section 213*a* of the reinforcement insulating layer 213 and the superconducting wires 100 constituting the superconducting shield layers 114.

5 Claims, 11 Drawing Sheets

INTERMEDIATE CONNECTION UNIT OF SUPERCONDUCTING CABLES

CROSS-REFERENCE TO RELATED APPLICATIONS

This application is a U.S. National Stage application of PCT Patent Application No. PCT/JP2013/052756, filed Feb. 6, 2013 and entitled "INTERMEDIATE CONNECTION PART FOR SUPERCONDUCTIVE CABLE"; which claims priority to Japanese Patent Application No. 2012-120687, filed May 28, 2012. The entireties of the above-referenced applications are incorporated herein by reference.

TECHNICAL FIELD

The present invention relates to an intermediate connection unit of superconducting cables.

BACKGROUND ART

A superconducting cable includes a cable core and a thermal insulation tube which has a vacuum double tube structure to contain the cable core wherein the cable core is formed by a superconductive conductor layer, an insulating layer, a shield layer and the like are layered around a former. A multilayer thermal insulator (Super Insulation) is intervened between the double tube structure and very low temperature liquid cooling medium (for example, liquid nitrogen) for cooling the cable core circulates inside the thermal insulation tube.

When using the superconducting cable as a power supply line, the superconducting cable needs to be laid out to a power consuming site far from the power source. However, single long cable has limitations in view of manufacturing or shipping of the superconducting cables. Therefore, when laying out the cable for a long distance, number of superconducting cables need to be connected to each other.

At the intermediate connection unit where the superconducting cables are connected, a reinforcement insulating layer is formed around the superconductive conductor layers. By providing a shield connection body which covers around the reinforcement insulating layer and which connects with the shield layer, the magnetic field which occurs when a large amount of current flows in the superconductive conductor layer does not leak outside from the intermediate connection unit (for example, see patent document 1).

PRIOR ART DOCUMENTS

Patent Documents

Patent Document 1: Japanese Patent Application Laid Open Publication No. 2011-45169

DISCLOSURE OF THE INVENTION

Problems to be Solved by the Invention

However, in the case of the above patent document 1, because a space which is to be filled with liquid nitrogen at the time of cooling is provided between the shield connection body, which covers around the reinforcement insulating layer formed thicker than the radius of the superconducting cable, and the reinforcement insulating layer, there is a problem that the intermediate connection unit be large.

An object of the present invention is to provide an intermediate connection unit for the superconducting cables having a good configuration where the magnetic field does not leak outside of the cable easily.

Means for Solving the Problem

In order to solve the above problems, the invention described in claim 1 is an intermediate connection unit of superconducting cables which are connected by a pair of cable cores each of which including an electric insulating layer and a superconducting shield layer, in an order, on an outer periphery of a superconductive conductor, the intermediate connection unit including a reinforcement insulating layer including a large radius section formed thicker than a cable core and inclined surface sections inclined toward electric insulating layers from the large radius section, the reinforcement insulating layer covering a connection parts of superconductive conductors, and a plurality of connecting superconducting wires which connect a plurality of superconducting wires arranged so as to cover an outer periphery of the large radius section and a plurality of superconducting wires constituting superconducting shield layers, and the connecting superconducting wires have a tapered a shape tapered toward electric insulating layer sides from the large radius section.

The invention described in claim 2 is the intermediate connection unit of the superconducting cables according to claim 1, wherein a ratio of a width of an end of each of the connecting superconducting wires on large radius section side to a width of an end of the connecting superconducting wire on a electric insulating layer side corresponds to a ratio of a radius of the reinforcement insulating layer at the large radius section to a radius of the cable code at the electric insulating layer.

The invention described in claim 3 is the intermediate connection unit of the superconducting cables according to claim 1 or 2, further including strip-shaped superconducting wires which are wound in a circumference direction of the superconducting cables at parts where one ends of the connecting superconducting wires and ends of the superconducting wires arranged on the outer periphery of the large radius section face each other and parts where the other ends of the connecting superconducting wires and ends of the superconducting wires constituting the superconducting shield layers, respectively, wherein the superconducting wires, the connecting superconducting wires and the strip-shaped superconducting wires are tape-shaped superconducting wires each of which formed by at least a superconducting layer layered on a substrate, and a surface of each strip-shaped superconducting wires where the superconducting layer is layered on the substrate faces the surfaces of corresponding superconducting wire and connecting superconducting wire where superconducting layers are layered on substrates.

The invention described in claim 4 is the intermediate connection unit of the superconducting cables according to claim 1 or 2, wherein one ends of the connecting superconducting wires slightly overlap ends of the superconducting wires arranged on an outer periphery of the large radius section and other ends of the connecting superconducting wires overlap ends of the superconducting wires constituting the superconducting shield layers, the superconducting wires and the connecting superconducting wires are tape-shaped superconducting wires each of which formed by at least a superconducting layer being layered on a substrate, and each of the connecting superconducting wires is arranged so that a surface thereof where the superconducting layer is layered on the substrate face surfaces of the superconducting wires where superconducting layers are layered on substrates.

The invention described in claim 5 is the intermediate connection unit of the superconducting cables according to any one of claims 1 to 4, further including a strip-shaped constriction wire which fastens the plurality of connecting superconducting wires to the inclined surface sections.

Effect of the Invention

According to the present invention, an intermediate connection unit for the superconducting cables having a good configuration where the magnetic field does not leak outside of the cable easily can be obtained.

BEST MODE FOR CARRYING OUT THE INVENTION

Hereinafter, preferred embodiments for carrying out the present invention will be described by using the drawings. However, although the following embodiment includes various limitations technically preferred for carrying out the present invention, the scope of the present invention is not limited to the following embodiment and the examples shown in the drawings.

[Superconducting Cable]

Figure 1:
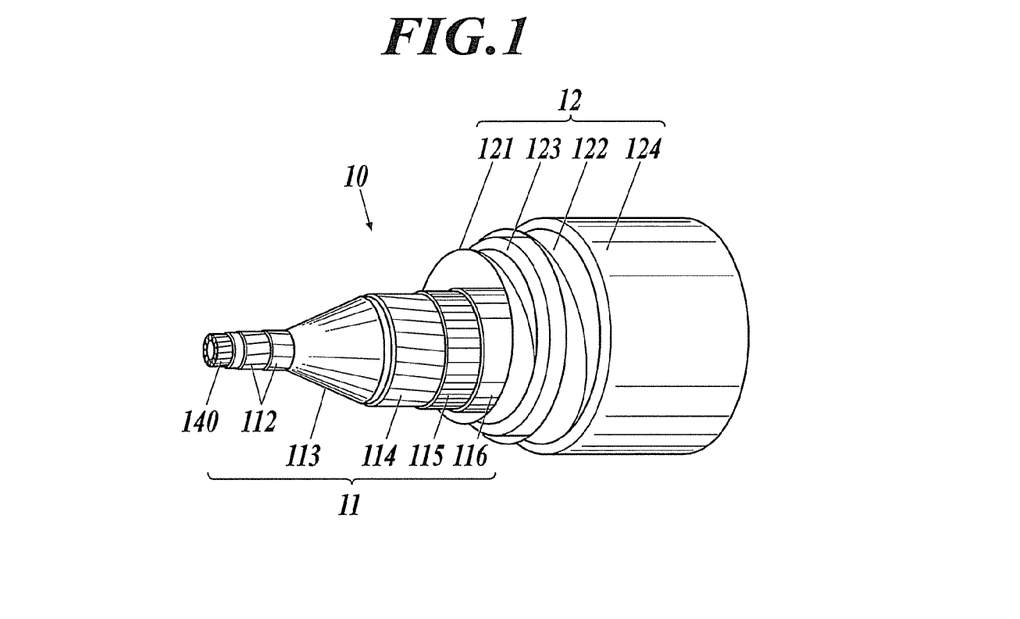
FIG. 1 is a perspective view showing a structure of a superconducting cable.

FIG. 1 is a drawing showing an example of a superconducting cable.

The superconducting cable 10 is a single core superconducting cable which houses a single core cable core 11 in the thermal insulation tube 12. The cable core 11 includes a former 140, a superconductive conductor layer 112, an electric insulating layer 113, a superconducting shield layer 114, a normal conducting shield layer 115, a protecting layer 116, etc.

The former 140 is a core for winding to form the cable core 11 and, for example, is formed by twisting normal conducting wires such as copper wires. In the former 140, the fault current which flows in the superconductive conductor layer 112 at the time of short circuit branches in.

Further, the former 140 is formed so that the inside thereof is hollow, and the hollow part is supplied with a liquid cooling medium (for example, liquid nitrogen) for cooling the former 140 and the superconductive conductor layer 112. Here, the liquid cooling medium is the same as what is supplied to the surrounding of the cable core 11 in the after-mentioned thermal insulation tube 12.

The superconductive conductor layer 112 is formed by winding a plurality of superconducting wires on the former 140 via carbon paper (not shown). In FIG. 1, the superconductive conductor layer 112 is in a two-layer structure. Transmission current flows in the superconductive conductor layer 112 during a steady operation.

Figure 2:
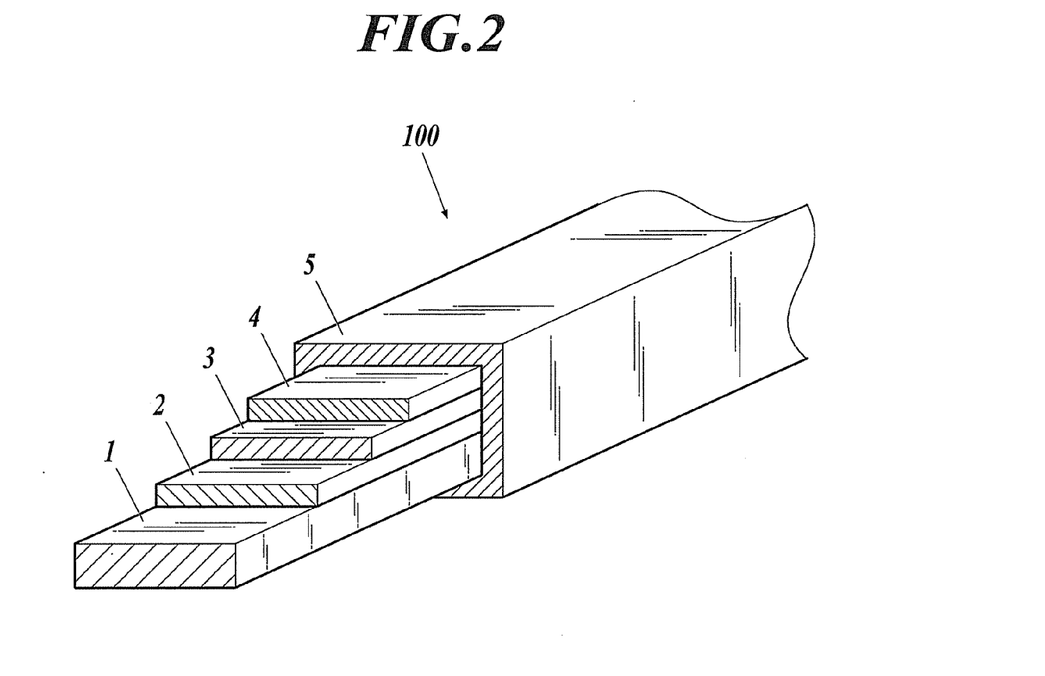
FIG. 2 is an explanatory drawing showing a layer configuration of a superconducting wire.

Each superconducting wire 100 which constitutes the superconductive conductor layer 112 is a tape-shaped superconducting wire including a laminated body formed by an intermediate layer 2, a superconducting layer 3 and a protecting layer 4 being layered on a substrate 1 in an order and a copper stabilizing layer 5 which covers around the laminated body as shown in FIG. 2, for example.

As for the superconductor constituting the superconducting layer 3, representative materials are RE-based superconductors (RE: rare earth element) being superconductive at liquid nitrogen temperature or higher, for ecample, an yttterium-based superconductor (hereinafter, a Y-based superconductor) expressed by the chemical formula $YBa_2Cu_3O_{7-y}$. Further, as for the superconductor, bithmuth-based superconductors, for example, those having the chemical formulas $Bi_2Sr_2CaCu_2O_{8+\delta}$ (Bi2212) and $Bi_2Sr_2Ca_2Cu_3O_{10+\delta}$ (Bi2223) can be applied, and a multiconductor wire formed by arranging a plurality of filamentary superconductors in a metal matrix can be used instead of the laminated body shown in FIG. 2. Here, δ in the chemical expressions indicates a nonstoichiometric amount of oxygen.

The electric insulating layer 113 is formed by a type of insulating sheet such as insulating paper, semi-synthesized paper wherein a sheet of insulating paper and a polypropylene film are attached or a polymer non-woven fabric tape. The electric layer 113 is formed in a layered state by being wound on the superconductive conductor layer 112.

The superconducting shield layer 114 is formed by spirally winding a plurality of superconducting wires on the electric insulating layer 113 via a sheet of carbon paper (not shown). In FIG. 1, the superconducting shield layer 114 is formed to have one layer structure. In the superconducting shield layer 114, current which is approximately the same as the conductive current flows in opposite phase due to the electromagnetic induction during a steady operation. Further, the superconducting shield layer 114 has a function for not leaking the magnetic field, which occurs when a large current flows in the superconductive conductor layer 112, outside.

As for the superconducting wires constituting the superconducting shield layer 114, the superconducting wires 100 (see FIG. 2) similar to those used in the superconductive conductor layer 112 may be applied.

The normal conducting shield layer 115 is formed by winding normal conducting wires such as copper wires on the superconducting shield layer 114. The fault current which flows through the superconducting shield layer 114 upon short circuit is branched into the normal conducting shield layer 115.

A protecting layer 116 is formed of a sheet of insulating paper, a polymer non-woven fabric or the like and is formed by being wound on the normal conducting shield layer 115, for example.

The thermal insulation tube 12 has a double tube structure formed by a thermal insulation internal tube 121 which houses the cable core 11 and is filled with cooling medium (for example, liquid nitrogen) and a thermal insulation external tube 122 which is arranged so as to cover the outer circumference of the thermal insulation internal tube 121.

Each of the thermal insulation internal tube 121 and the thermal insulation external tube 122 are a stainless-steel corrugated tube (a wavelike tube), for example. A multilayer thermal insulator (Super Insulation) 123 formed by a laminated body of polyethylene film which is vapor-deposited with aluminum, for example, intervenes between the thermal insulation internal tube 121 and the thermal insulation external tube 122 to be held in a vacuum state. Also, the outer circumference of the thermal insulation external tube 122 is covered with a corrosion-resistant layer 124 formed by polyvinyl chloride (PVC), polyethylene and such like.

[Intermediate Connection Unit of Superconducting Cables]

Next, with respect to the intermediate connection unit of the superconducting cables, the intermediate connection unit 50 of the superconducting cables which connects a pair of cable cores 11 (superconducting cables 10), each of which having the electric insulating layer 113 and the superconducting shield layer 114 at the outer circumference of the superconductive conductor layer 112 in an order, will be described.

Figure 3A:
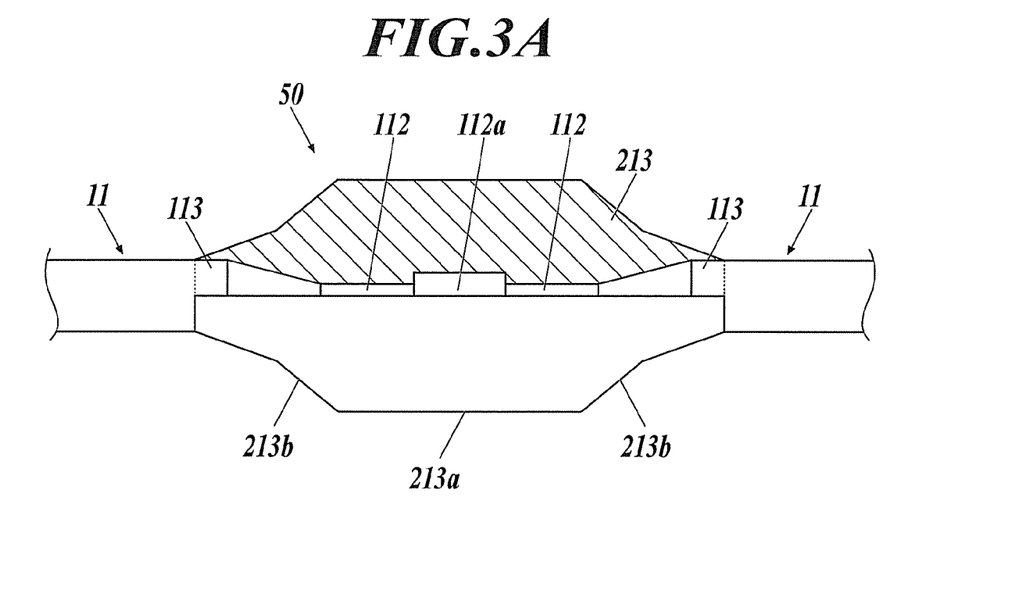
FIG. 3A is an explanatory drawing showing a cross-section view of a part of a reinforcement insulating layer in an intermediate connection unit of the superconducting cables.
Figure 3B:
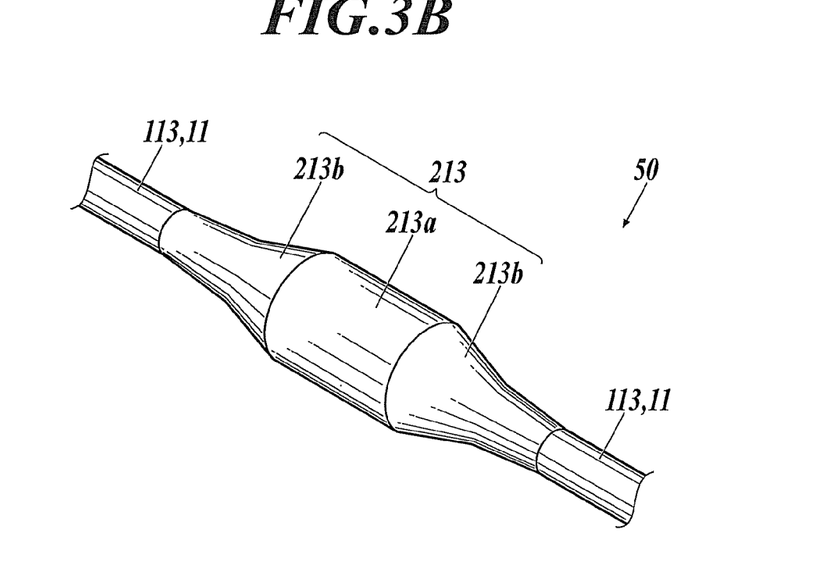
FIG. 3B is a perspective view showing the reinforcement insulating layer in the intermediate connection unit of the superconducting cables.
Figure 4A:
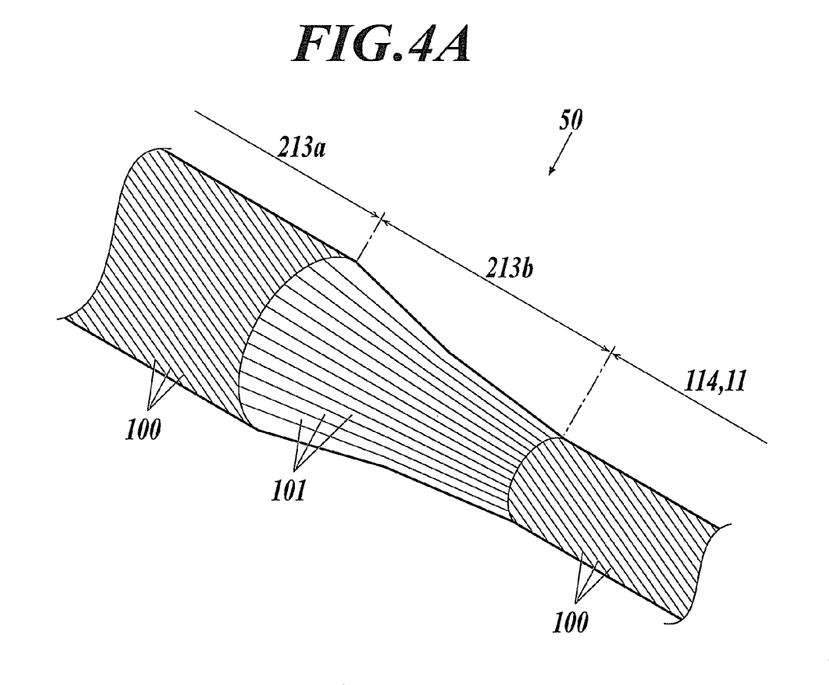
FIG. 4A is a perspective view showing the intermediate connection unit formed by arranging the superconducting wires and the connecting superconducting wires on the reinforcement insulating layer.
Figure 4B:
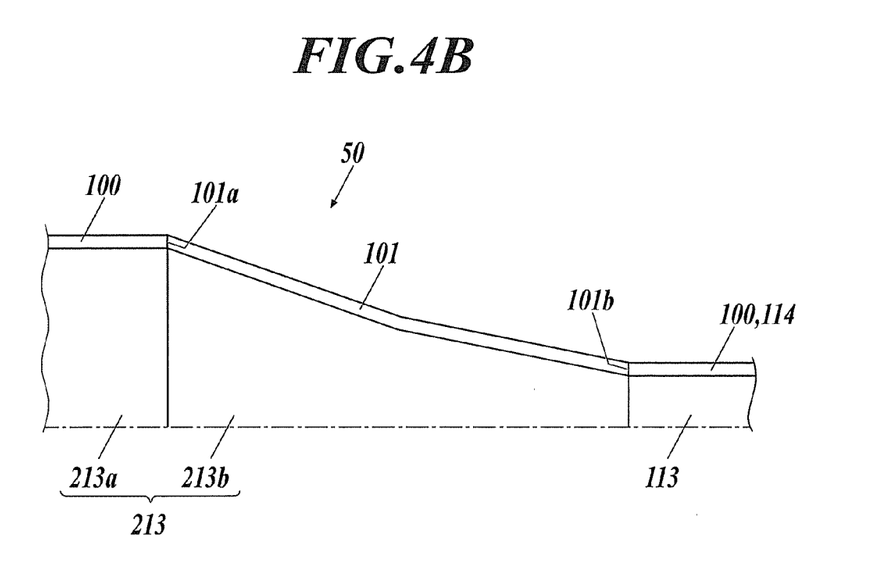
FIG. 4B is an explanatory drawing showing a connecting structure of superconducting wires at the intermediate connection unit formed by arranging the superconducting wires and the connecting superconducting wires on the reinforcement insulating layer.

FIG. 3A is an explanatory drawing showing a cross-sectional view of a part of the reinforcement insulating layer 213 of the intermediate connection unit 50 of the superconducting cables. FIG. 3B is a perspective view showing the reinforcement insulating layer 213 of the intermediate connection unit 50. FIG. 4A is a perspective view showing the intermediate connection unit 50 formed by arranging a plurality of superconducting wires on the reinforcement insulating layer 213. FIG. 4B is an explanatory drawing showing a connection structure of the superconducting wires at the intermediate connection unit 50.

At the cable connection part of the superconducting cables 10, the electric insulating layers 113 are stripped stepwise at ends of the cable cores 11 of the superconducting cables 10, the exposed superconductive conductor layers 112 are connected by a conductor connecting member 112a and the reinforcement insulating layer 213 is provided so as to cover around the connecting part of the superconductive conductor layer 112. On the reinforcement insulating layer 213, a plurality of superconducting wires (the superconducting wires 100, the connecting superconducting wires 101) are arranged to form the intermediate connection unit 50.

The reinforcement insulating layer 213 is formed thicker than the radius which is from the former 140 to the electric insulating layer 113 in the cable core 11 of the superconducting cable 10. The reinforcement insulating layer 213 further includes a large radius section 213a in a cylindrical shape where its outer diameter is approximately constant and inclined surface section 213b respectively inclined toward the electric insulating layers 113 from both ends of the large radius section 213. In FIGS. 3A and 3B, the inclined surface sections 213b respectively have constrictions between the inclined surfaces of two-step having different angles.

The reinforcement insulating layer 213 is formed by winding an insulating sheet similar to that used in the electric insulating layer 113 around the connection part of the superconductive conductor layers 112.

Here, the inclined surface sections 213b are not limited to inclined surfaces of two-step having different angles, and the inclined surfaces may be in three steps or more. It is preferred that the inclined surfaces which incline toward the electric insulating layers 113 from the large radius sections 213a are close to a curve shape as much as possible. On the other hand, in case of low voltage cables of 66 kV class, for example, the thickness of the insulating layer may be thin and the inclined surface sections 213b may be inclined surfaces of one-step (no constrictions in the inclined surfaces).

Here, as shown in FIGS. 4A and 4B, the superconducting shield layers 114 are respectively provided around the electric insulating layers 113 of the cable cores 11 by a plurality of superconducting wires 100 being wound on the electric insulating layers 113. Further, a plurality of superconducting sires 100 are wound on the outer circumference of the large radius section 213a of the reinforcement insulating layer 213.

Then, by providing a plurality of connecting superconducting wires 101 which cones the plurality of superconducting wires 100 arranged so as to cover the outer circumference of the large radius section 213a and the plurality of superconducting wires 100 constituting the superconducting shield layer 114 and which cover the inclined surface sections 213b, the intermediate connection unit 50 of the superconducting cables is formed.

In other words, the intermediate connection unit 50 of the superconducting cables includes the reinforcement insulating layer 213 which covers around the connection section of the superconductive conductor layers 112 connected by the conductor connecting member 112a, the plurality of superconducting wires 100 arranged so as to cover the outer periphery of the large radius section 213a of the reinforcement insulating layer 213 and the plurality of connecting superconducting wires 101 which connect the plurality of superconducting wires 100 arranged on the large radius section 213a and the plurality of superconducting wires 100 constituting the superconducting shield layer 114 and which cover the inclined surface sections 213b of the reinforcement insulating layer 213.

Although the superconducting wires 100 are spirally wound in FIG. 4A, the superconducting wires 100 do not have to be arranged spirally and they may be disposed along the longitudinal direction of the cable cores 11 linearly.

Each of the connecting superconducting wires 101 is a tape-shaped superconducting wire having approximately trapezoid shape where the width at one end is wider than the width at the other end.

The connecting superconducting wires 101 form a tapered shape toward the electric insulating layer 113 (the superconducting shield layer 114) sides from the large radius section 213a in a state being arranged so as to cover the inclined surface sections 213b of the reinforcement insulating layer 213. Further, in each connecting superconducting wire 101, one end 101a having wider width is connected with a superconducting wire 100 arranged on the large radius section 213a and the other end 101b thereof having narrower width is connected with a superconducting wire 100 constituting the superconducting shield layer 114.

As for the connecting superconducting wires 101, tape-shaped superconducting wires (see FIG. 2) having the same configuration as the superconducting wires 100 can be applied. The connecting superconducting wires 101 are arranged in the same direction in the layering direction as the superconducting wires 100 arranged on the large radius section 213a and the superconducting wires 100 constituting the superconducting shield layer 114, the same direction in the layering direction being the direction in which the side of the substrate 1 where the superconducting layer 3 is layered facing outside (the direction in which the substrate side faces inside), for example.

Figure 5:
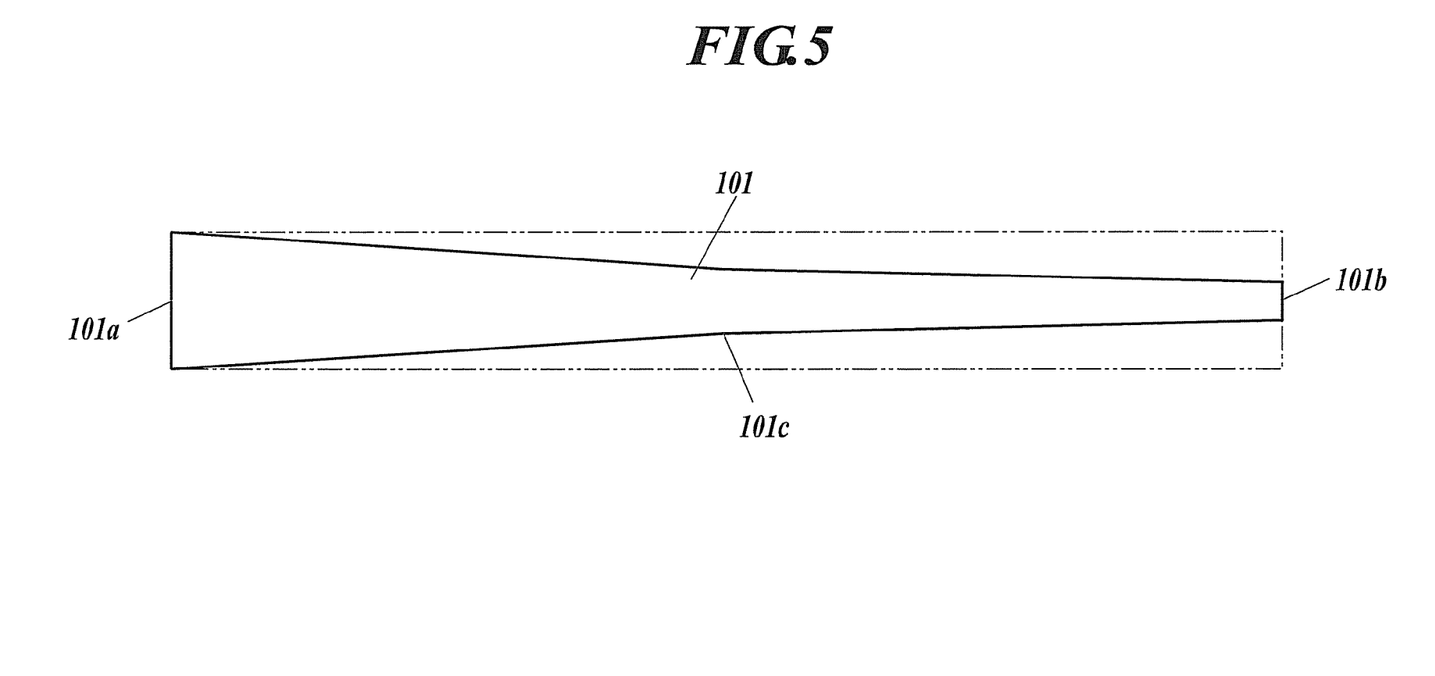
FIG. 5 is a plane view showing an example of a connecting superconducting wire.

FIG. 5 is a plane view showing an example of a connecting superconducting wire 101.

As shown in FIG. 5, the connecting superconducting wire 101 has an approximately trapezoid shape and has the construction part 101c at approximately center in its longitudinal direction where margins of different inclined angles intersect. In particular, in the connecting superconducting wire 101, the trapezoid shape on the one end 101a side having wider width and the trapezoid shape on the other end 101b side having narrower width have different tapering angles. The connecting superconducting wire 101 has a shape where the trapezoid shapes having difference tapered angles intersect to be integral at the constriction part 101c at approximately center in it longitudinal direction.

Here, the ratio of the width of the end 101a on the large radius section 213a side to the width of the end 101b on the electric insulating layer 113 (superconducting shield layer 114) side to the width of the constriction part 101c in the connecting superconducting wire 101 corresponds to the ratio of the radius of the large radius section 213 in the reinforcement insulating layer 213 to the radius of the electric insulating layer 113 portion in the cable core 11 of the superconducting cable 10 to the radius of the constriction part between the inclined surfaces having different angles in the inclined surface section 213b.

The connection superconducting wire 101 can be obtained by performing laser cut processing or slitter processing on a rectangular superconducting wire. Since the cut plane by the laser cut fuses by heat, the superconducting wire can be cut into desired shape and size without having a trouble such as the superconducting layer 3 peeling off. Therefore, it is preferable to form the connecting superconducting wire 101 by the laser cut processing.

In such way, the intermediate connection unit 50 of the superconducting cables 10 includes the reinforcement insulating layer 213 which is formed wider than the diameter of the cable cores 11 of the superconducting cables 10, and the inclined surface sections 213b can be covered with no space by the plurality of connecting superconducting wires 101, the wires not being overlapped, by arranging the connecting superconducting wires 101 covering the inclined surface sections 213b of the reinforcement insulating layer 213 in approximate trapezoid shape tapered toward the electric insulating layer 113 sides from the large radius section 213a side in the reinforcement insulating layer 213.

Therefore, it can be said that the intermediate connection unit 50 of the superconducting cables according to the present invention has a good configuration where the magnetic field which occurs when a large amount of current flows in to the superconductive conductor layer does not leak outside easily.

Further, it is preferred that the strip-shaped superconducting wires 102 are provided at the connection parts of the connecting superconducting wires 101 and the superconducting wires 100 in the intermediate connection unit 50 of the superconducting cables 10.

Figure 6A:
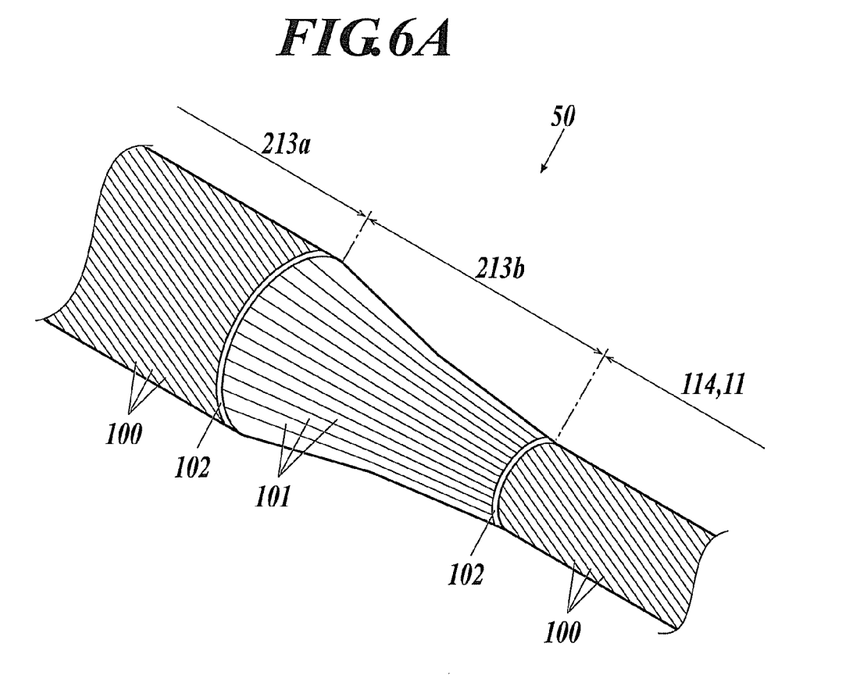
FIG. 6A is a perspective view showing the intermediate connection unit formed by arranging the superconducting wires, the connecting superconducting wires and strip-shaped superconducting wires on the reinforcement insulating layer.
Figure 6B:
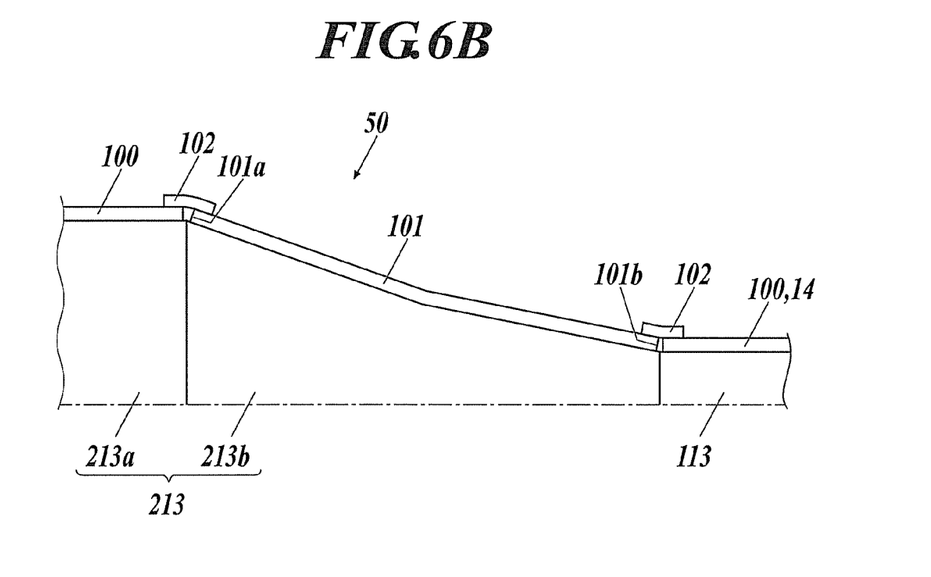
FIG. 6B is an explanatory drawing showing a connection structure of superconducting wires at the intermediate connection unit formed by arranging the superconducting wires, the connecting superconducting wires and the strip-shaped superconducting wires on the reinforcement insulating layer.

FIG. 6A is a perspective view showing the intermediate connecting unit formed by arranging the superconducting wires, the connecting superconducting wires and the strip-shaped superconducting wires on the reinforcement insulating layer. FIG. 6B is an explanatory drawing showing a connection structure of the superconducting wires in the intermediate connection unit.

For example, as shown in FIGS. 6A and 6B, the part where the one ends 101a of the connecting superconducting wires 101 and end of the superconducting wires 100 arranged on the outer peripheral of the large radius section 213a face each other and the part where the other ends 101b in the connecting superconducting wires 101 and ends of the superconducting wires 100 which constitute the superconducting shield layers 114 face each other are provided with the strip-shaped superconducting wires 102 spirally wound in the circumferential direction.

Since the strip-shaped superconducting wires 102 are wound on the cable cores 11 of the superconducting cables 10 in the circumferential direction, the strip-shaped superconducting wires 102 arranged on the large radius section 213a sides have the length about the same as the circumference of the large radius section 213a, and the strip-shaped superconducting wires 102 arranged on the electric insulating layer 113 (the superconducting shield layer 114) sides have the length about the same as the circumferences of the electric insulating layers 113.

As for such strip-shaped superconducting wire 102, a tape-shaped superconducting wire (see FIG. 2) having the similar configuration as the superconducting wire 100 can be applied.

In such way, by winding the strip-shaped superconducting wires 102 respectively at the parts where the ends (101a, 101b) of the connecting superconducting wires 101 and the ends of the superconducting wires 100 face each other, the connecting superconducting wires 101 and the superconducting wires 100 can be electrically connected via the strip-shaped superconducting wires 102 even in a case where there are spaces between the ends (101a, 101b) of the connecting superconducting wires 101 and the superconducting wires 100.

Here, even in a case where there is no space between the connecting superconducting wires 101 and the superconducting wires 100 and they are connected in a good manner as shown in FIGS. 1A and 4B, by winding the strip-shaped superconducting wires 102 at the parts where the ends (101a, 101b) of the connecting superconducting wires 101 face the superconducting wires 100, their electrical connection can be assured and enhanced and their mechanical connectional can also be assured.

Here, the superconducting wires 100, the connecting superconducting wires 101 and the strip-shaped superconducting wires 102 are tape-shaped superconducting wires formed of at least the superconductor layer 3 being layered on the substrate 1. Each of the strip-shaped superconducting wires 102 is arranged so that the surface thereof where the superconductor layer 3 is layered on the substrate 1 faces the surfaces of a superconducting wire 100 and a connecting superconducting wire 101 where the superconductor layers 3 are layered on the substrates 1.

Figure 7:
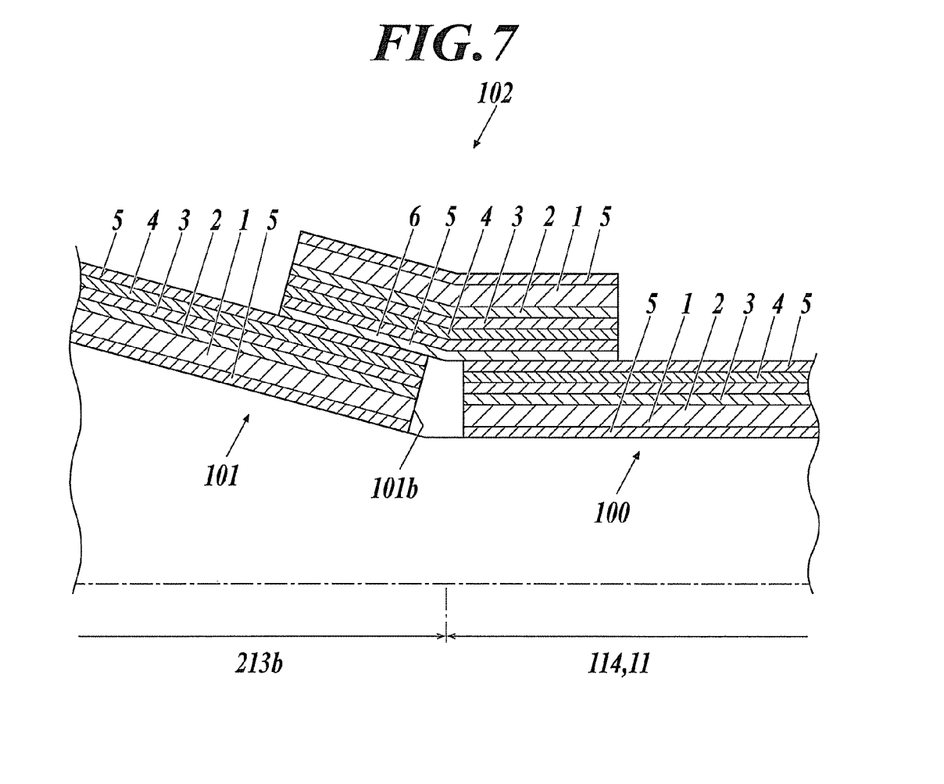
FIG. 7 is an explanatory drawing relating to front and back sides of the superconducting wires at the connection part of the superconducting wires, the connecting superconducting wires and the strip-shaped superconducting wires.

In particular, as shown in FIG. 7, the superconducting wires 100 and the connecting superconducting wires 101 are arranged so that the superconductor layer 3 sides thereof, the superconductor layers 3 being layered on the substrate 1, face the strip-shaped superconducting wires 102. Further, the strip-shaped superconducting wires 102 are arranged so that the superconductor layer 3 sides thereof, the superconductor layers 3 being layered on the substrate 1, face the superconducting wires 100 and the connecting superconducting wires 101. In other words, the strip-shaped superconducting wires 102 are connected with the superconducting wires 100 and the connecting superconducting wires 101 in a state where their front and back sides are reversed so that the surfaces on the superconductor layer 3 sides face each other.

Moreover, soldering layers 6 (or silver pastes) are provided between the superconducting wires 100 and the strip-shaped superconducting wires 102 and between the connecting superconducting wires 101 and the strip-shaped superconducting wires 102, and the superconducting wires are connected to each other via the soldering layers 6.

Here, in FIG. 7, the strip-shaped superconducting wire 102 wound around the part where the other end 101b of the connecting superconducting wire 101 and as end of the superconducting wire 100 constituting the superconducting shield layer 114 face each other is shown. However, the direction of the strip-shaped superconducting wire 102 which is wound around the part where the one end 101a of the connecting superconducting wire 101 and an end of the superconducting wire 100 arranged on the outer periphery of the large radius section 213a face each other is also the same direction; thus, the description thereof is omitted.

In FIGS. 6A, 6B and 7, the part where the one end 101a of the connecting superconducting wire 101 and an end of the superconducting wire 100 arranged on the outer periphery of the large radius section 213a face each other and the part where the other end 101b of the connecting superconducting wire 101 and an end of the superconducting wire 100 constituting the superconductor shield layer 114 face each other are respectively provided at the boundary parts between the inclined surface section and the electric insulating layer 113 and between the inclined surface section and the large radius section 213a. However, these facing parts may be provided at flat parts of the electric insulating layer 113 and the large radius section 213a. In such case, the strip-shaped superconducting wires 102 can be wound around the flat parts and this is preferable in the aspect that the force do not tend to concentrate at the connection parts or that connecting operation by soldering (or by silver paste) is easy.

In order to form such facing parts, the connecting superconducting wires 101 should be extended to an extent that the strip-shaped superconducting wires 102 can be wound at the flat parts on the electric insulating layers 113 and the large radius section 213a. For example, the connecting superconducting wires 101 which overlap by about 100 mm at the electric insulating layer 113 sides and at the large radius section 213a sides are to be used.

In such way, if the strip-shaped superconducting wires 102 are wound at the parts where the ends 101a and 101b of the connecting superconducting wires 101 and the ends of the superconducting wires 100 face in the intermediate connection unit 50 of the superconducting cables, the connections between the parts where the ends 101a and 101b of the connecting superconducting wires 101 and the ends of the superconducting wires 100 can be enforced and the intermediate connection unit can be attached more reliably so that the plurality of connecting superconducting wires 101 do not separate from the inclined surface sections 213b. Therefore, the magnetic field is even less prone to be leaked outside.

Figure 8:
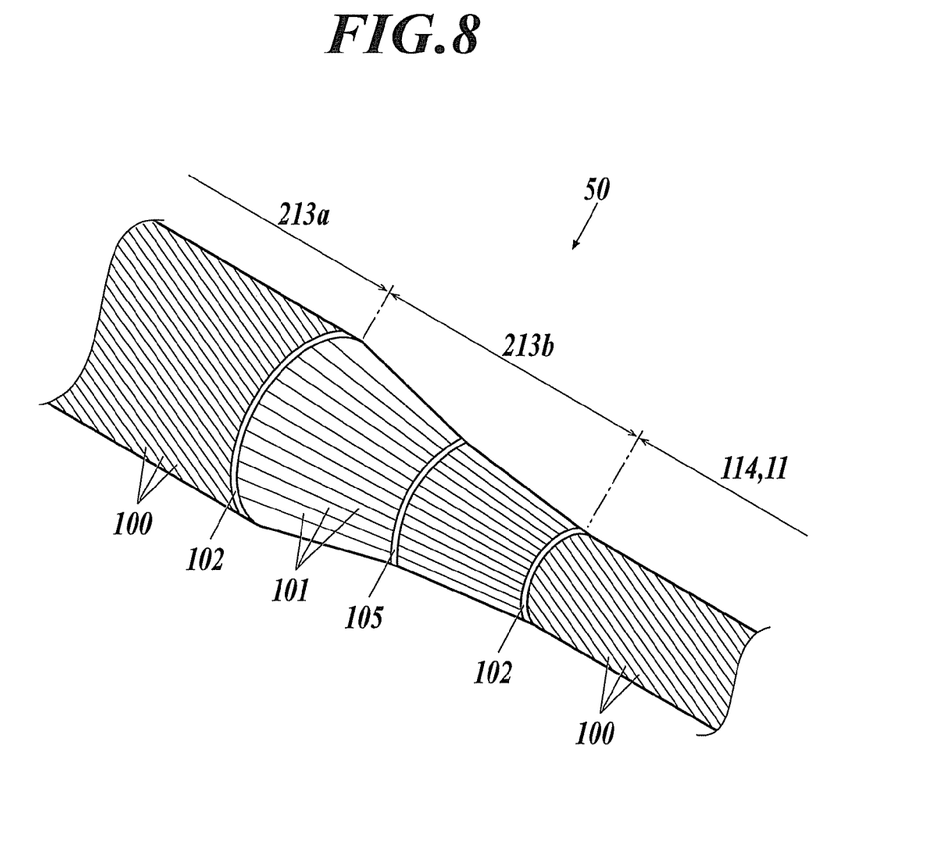
FIG. 8 is a perspective view showing the intermediate connection unit formed by arranging the superconducting wires, the connecting superconducting wires, the strip-shaped superconducting wires and a strip-shaped constriction wire on the reinforcement insulating layer.

Further, it is preferred to provide a strip-shaped constriction wire 105 which fastens the plurality of connecting superconducting wires 101 to the inclined surface sections 213a as shown in FIG. 8.

The strip-shaped constriction wire 105 is a conductive member, and from a view point of shape retention and a view point of being a path at the time of generation of abnormal current such as in an accident or the like, it is preferred that the strip-shaped constriction wire 105 is formed of a copper wire or a copper tape. Further, as the strip-shaped constriction wire 105, the tape-shaped superconducting wire having the similar configuration as the superconducting wires 100 can be used. If a superconducting wire is used as the strip-shaped constriction wire 105, this is preferable in a view point of reduction in loss of conductivity due to homogenization of current.

By winding the strip-shaped constriction wire 105 at the positions corresponding to the constriction parts of the inclined surface sections 213b at the outer periphery of the plurality of connecting superconducting wires 101 to fasten the connecting superconducting wires 101 to the inclined surface sections 213b, the plurality of connecting superconducting wires 101 covering the inclined surface sections 213b do not shift easily and the plurality of connecting superconducting wires 101 can be attached to the inclined surface sections 213b appropriately.

In such way, if the strip-shaped constriction wire 105 is wound so as to fasten the plurality of connecting superconducting wires 101 to the inclined surface sections 213b in the intermediate connection unit 50 of the superconducting cables, the plurality of connecting superconducting wires 101 covering the inclined surface sections 213b do not shift easily and the shielding structure formed of the plurality of connecting superconducting wires 101 can be prevented from losing its shape. Therefore, the magnetic field is even less prone to be leaked outside.

Figure 9:
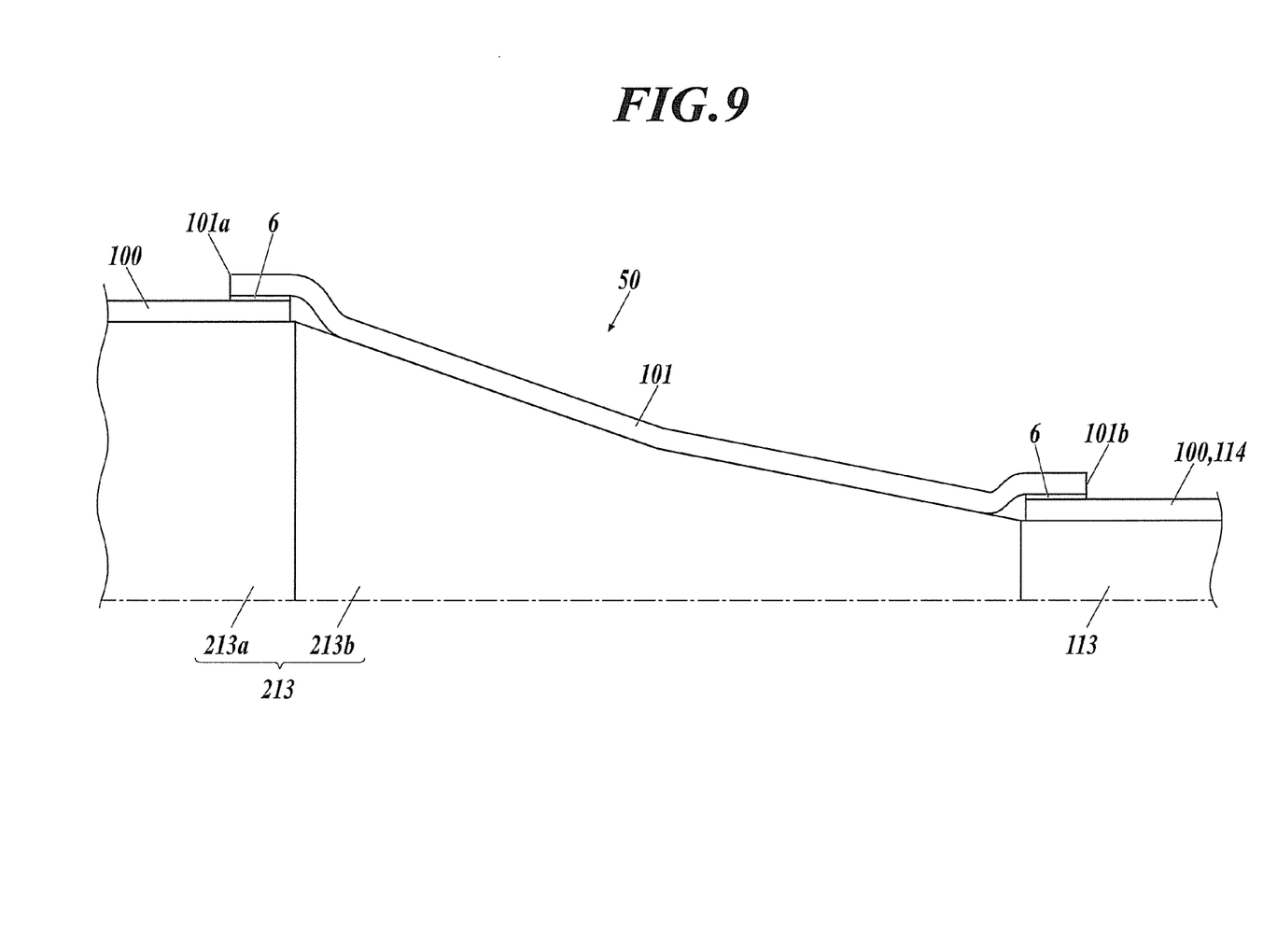
FIG. 9 is an explanatory drawing showing the intermediate connection unit of the superconducting cables which are connected so that the both ends of a connecting superconducting wire respectively overlap with ends of superconducting wires.

The present invention is not limited to the above embodiments. FIG. 9 is an explanatory drawing showing the intermediate connection unit of the superconducting cables where both ends of the connecting superconducting wires are connected so as to overlap with the ends of the superconducting wires, respectively.

For example, as shown in FIG. 9, the connecting superconducting wires 101 may be arranged on the inclined surface sections 213b so that one ends 101a of the connecting superconducting wires 101 slightly overlap the ends of the superconducting wires 100 arranged on the outer periphery of the large radius section 213a and so that the other ends 101b of the connecting superconducting wires 101 slightly overlap the ends of the superconducting wires 100 constituting the superconducting shield layers 114.

Here, the superconducting wires 100 and the connecting superconducting wires 101 are tape-shaped superconducting wires where at least the superconducting layer 3 being layered on the substrate 1. Each connecting superconducting wire 101 is arranged so that the surface side thereof where the superconducting layer 3 is layered on the substrate 1 face the surface sides of corresponding superconducting wires 100 where the superconducting layers 3 are layered on the substrates 1.

Figure 10:
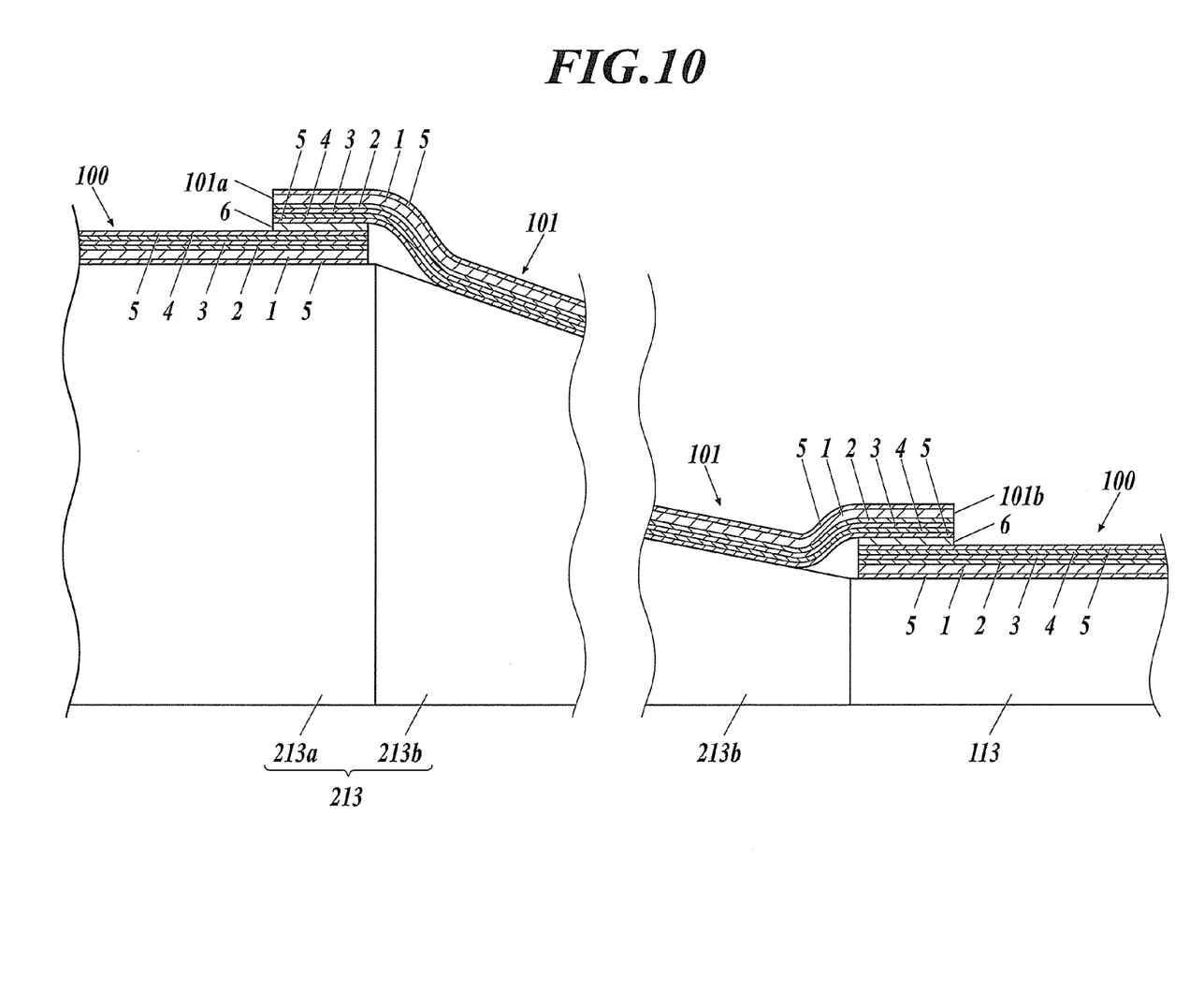
FIG. 10 is an explanatory drawing relating to front and back sides of the superconducting wires at the connecting part of the superconducting wires and the connecting superconductive wires.

In particular, as shown in FIG. 10, the superconducting wires 100 are arranged so that the superconducting layer 3 sides thereof, the superconducting layers 3 being layered on the substrates 1, face the connecting superconducting wires 101, and the connecting superconducting wires 101 are arranged so that the superconducting layer 3 sides thereof, the superconducting layers 3 being layered on the substrates 1, face the superconducting wires 100. In other words, the connecting superconducting wires 101 and the superconducting wires 100 are connected to each other in a state where the front and back sides thereof are reverse of each other so that their superconducting layer 3 sides face each other.

Further, soldering layers 6 (or silver pastes) are provided between the superconducting wires 100 and the connecting superconducting wires 101, and the superconducting wires are connected to each other via the soldering layers 6.

Even in a case of the intermediate connection unit 50 of the superconducting cables where the superconducting cables are connected by the two ends of the connecting superconducting wires 101 covering the inclined surface sections 213b being slightly overlapped on the superconducting wires 100 arranged on the outer periphery of the large radius section 213a and the superconducting wires 100 constituting the superconducting shield layers 114, the magnetic field which occurs when a large amount of current flows in to the superconductive conductor layer 112 does not leak outside easily.

Figure 11:
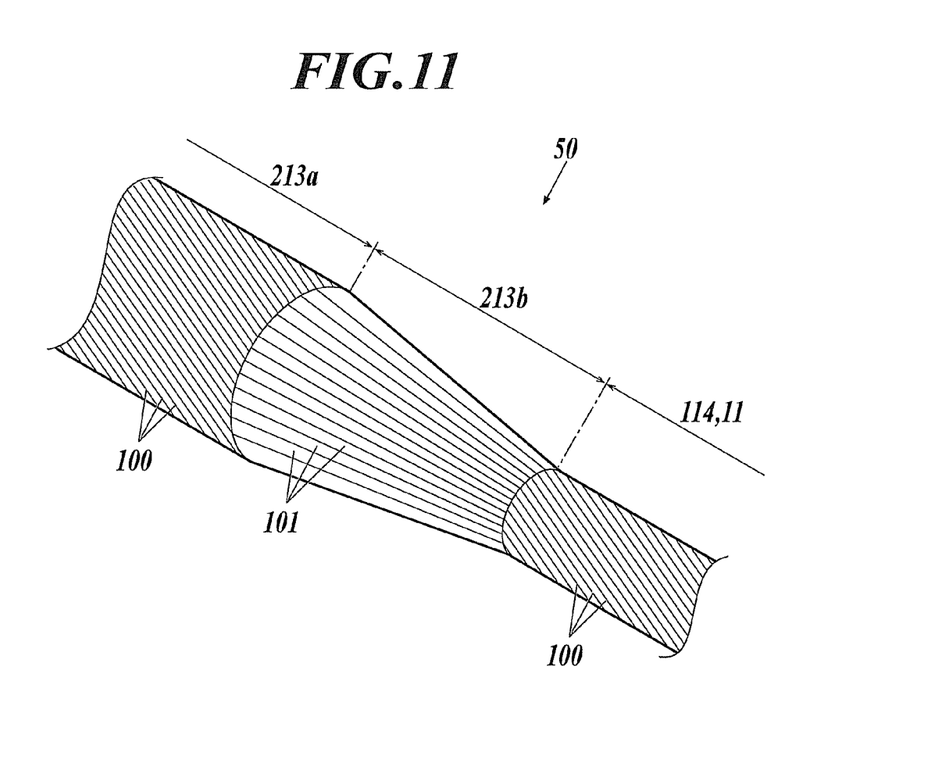
FIG. 11 is a perspective view showing the intermediate connection unit formed by the superconducting wires and the connecting superconductive wires arranged on the reinforcement insulating layer.
Figure 12:
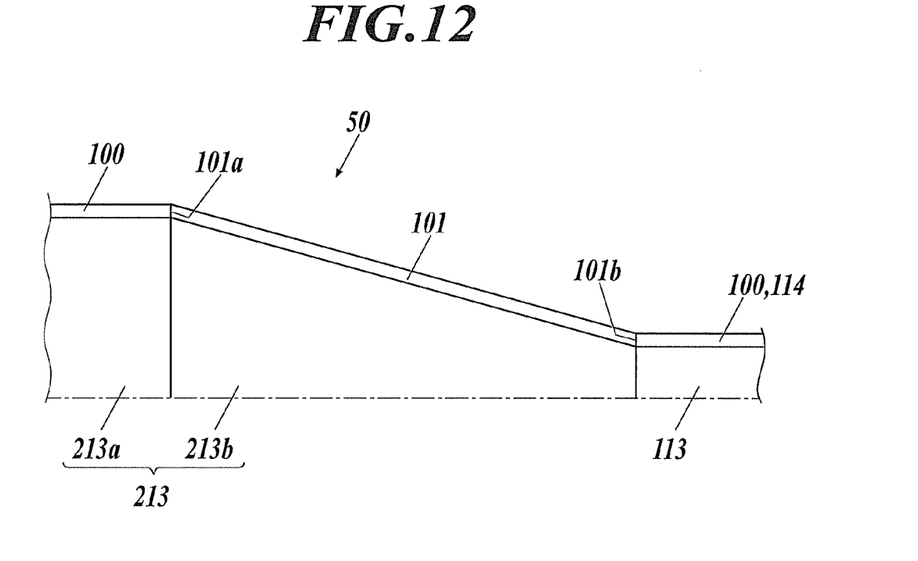
FIG. 12 is an explanatory drawing showing a connection structure of the superconducting wires at the intermediate connection unit formed by arranging the superconducting wires and the connecting superconducting wires on the reinforcement insulating layer.

The present invention is not limited to be above embodiment. For example, in a case where the inclined surface sections 213b of the reinforcement insulating layer 213 in one-step inclined surfaces not having constrictions as shown in FIGS. 11 and 12, it is preferred to use connecting superconducting wires 101 not having the constriction parts 101c.

Figure 13:
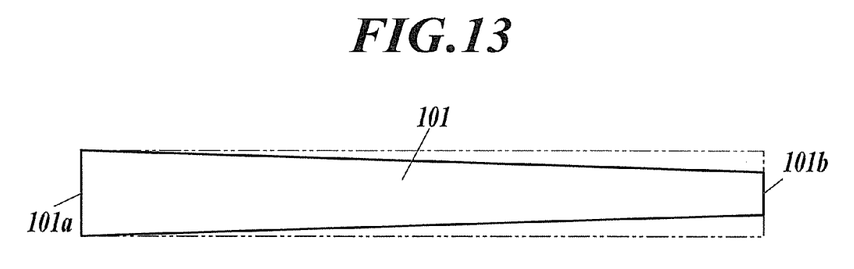
FIG. 13 is a plane view showing an example of a connecting superconducting wire.
Figure 14:
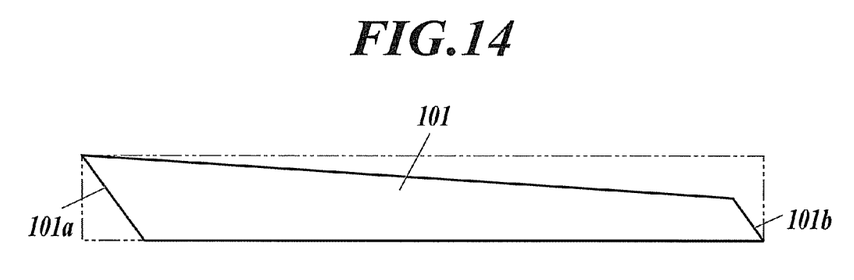
FIG. 14 is a plane view showing an example of a connecting superconducting wire.

As such connecting superconducting wires, the connecting superconducting wires 101 having an isosceles trapezoid shape shown in FIG. 13 and the connection superconducting wire 101 having a non-isosceles trapezoid shape shown in FIG. 14 can be suggested.

The connecting superconducting wire 101 having an isosceles trapezoid shape (see FIG. 13) is suited for arranging the connecting superconducting wires 101 on the inclined surface sections 213b along the longitudinal direction of the cable cores 11 and cover the inclined surface sections 213b. Further, the connection superconducting wire 101 having a non-isosceles trapezoid shape (see FIG. 14) is suited to spirally wind the connection superconducting wires 101 around the inclined surface sections 213b and cover the inclined surface sections 213b.

Here, the ratio of the width of the end 101a on the large radius section 213a side of a connecting superconducting wire 101 to the width of the end 101b on the electric insulating layer 113 (the superconducting shield layer 114) side of a connecting superconducting wire 101 correspond to the ratio of the radius of the large radius section 213a of the reinforcement insulating layer 213 to the radius of the electric insulating layer 113 at the cable core 11 of a superconducting cable 10.

In such way, in a case where the inclined surface sections 213b of the reinforcement insulating layer 213 is inclined surfaces with no constrictions, by using the connecting superconducting wires 101 having an isosceles trapezoid shape (see FIG. 13) or the connection superconducting wires 101 having a non-isosceles trapezoid shape (see FIG. 14), the inclined surface sections 213b can be covered without spaces and without the plurality of connecting superconducting wires 101 overlapping.

Even in such intermediate connection unit 50 of the superconducting wires, the magnetic field which occurs when a large amount of current flows in to the superconductive conductor layer 112 does not leak outside easily.

As described above, the intermediate connection unit 50 of the superconducting cables according to the present invention has a good configuration where the magnetic field which occurs when a large amount of current flows in the superconductive conductor layer 112 does not leak outside easily.

Here, application of the present invention is not limited to the above described embodiments, and the scope of the present invention can be changed arbitrarily.

For example, although the superconducting wires of laminated body are used in the embodiment, superconducting wires of multiconductor wire may be used. In a case of multiconductor wires, there is no need to consider the front and back when connecting the superconducting wires to each other. However, in a viewpoint of easily being in a normal conductive state at the time when a large amount of electricity flows due to abnormality, it is preferred to use the superconducting wires of laminated body.

INDUSTRIAL APPLICABILITY

The present invention has an applicability in the field of superconducting cable as an intermediate connection unit of superconducting cables by having the configuration as described above.

EXPLANATION OF REFERENCE NUMERALS 1 substrate
2 intermediate layer
3 superconducting layer
4 protecting layer
5 copper stabilizing layer
6 solder layer
10 superconducting cable
11 cable core
12 thermal insulation tube
50 intermediate connection unit (intermediate connection unit of superconducting cables)
100 superconducting wire
101 connecting superconducting wire
101a one end
101b the other end
102 strip-shaped superconducting wire
105 strip-shaped constriction wire
104 former
112 superconductive conductor layer (superconductive conductor)
113 electric insulating layer
114 superconducting shield layer
213 reinforcement insulating layer
213a large radius section
213b inclined surface section

The invention claimed is:

1. An intermediate connection unit of superconducting cables which are connected by a pair of cable cores, each cable core including an electric insulating layer and a superconducting shield layer in an order on an outer periphery of a superconductive conductor, the intermediate connection unit comprising:
   a reinforcement insulating layer including a large radius section formed thicker than a cable core and inclined surface sections inclined toward electric insulating layers from the large radius section, the reinforcement insulating layer covering a connection parts of superconductive conductors;
   a plurality of connecting superconducting wires which connect a plurality of superconducting wires arranged so as to cover an outer periphery of the large radius section and a plurality of superconducting wires constituting superconducting shield layers, wherein
   the connecting superconducting wires have a tapered a shape tapered toward electric insulating layer sides from the large radius section.

2. The intermediate connection unit of the superconducting cables according to claim 1, wherein a ratio of a width of an end of each of the connecting superconducting wires on large radius section side to a width of an end of the connecting superconducting wire on a electric insulating layer side corresponds to a ratio of a radius of the reinforcement insulating layer at the large radius section to a radius of the cable code at the electric insulating layer.

3. The intermediate connection unit of the superconducting cables according to claim 1, further comprising:
   strip-shaped superconducting wires which are wound in a circumference direction of the superconducting cables at parts where one ends of the connecting superconducting wires and ends of the superconducting wires arranged on the outer periphery of the large radius section face each other and parts where the other ends of the connecting superconducting wires and ends of the superconducting wires constituting the superconducting shield layers, respectively, wherein
   the superconducting wires, the connecting superconducting wires and the strip-shaped superconducting wires are tape-shaped superconducting wires each of which formed by at least a superconducting layer layered on a substrate, and
   a surface of each strip-shaped superconducting wires where the superconducting layer is layered on the substrate faces the surfaces of corresponding superconducting wire and connecting superconducting wire where superconducting layers are layered on substrates.

4. The intermediate connection unit of the superconducting cables according to claim 1, wherein
   one ends of the connecting superconducting wires slightly overlap ends of the superconducting wires arranged on an outer periphery of the large radius section and other ends of the connecting superconducting wires overlap ends of the superconducting wires constituting the superconducting shield layers,
   the superconducting wires and the connecting superconducting wires are tape-shaped superconducting wires each of which formed by at least a superconducting layer being layered on a substrate, and
   each of the connecting superconducting wires is arranged so that a surface thereof where the superconducting layer is layered on the substrate face surfaces of the superconducting wires where superconducting layers are layered on substrates.

5. The intermediate connection unit of the superconducting cables according to claim 1, further comprising a strip-shaped constriction wire which fastens the plurality of connecting superconducting wires to the inclined surface sections.

* * * * *